United States Patent
Anidjar et al.

(10) Patent No.: US 8,422,536 B2
(45) Date of Patent: Apr. 16, 2013

(54) SPREAD SPECTRUM CLOCK SIGNAL GENERATOR METHOD AND SYSTEM

(75) Inventors: Joseph Anidjar, Asbury, NJ (US); Parag Parikh, Allentown, PA (US); Vladimir Sindalovsky, Perkasie, PA (US)

(73) Assignee: LSI Corporation, San Jose, CA (US)

( * ) Notice: Subject to any disclaimer, the term of this patent is extended or adjusted under 35 U.S.C. 154(b) by 463 days.

(21) Appl. No.: 12/774,175

(22) Filed: May 5, 2010

(65) Prior Publication Data
US 2011/0274143 A1 Nov. 10, 2011

(51) Int. Cl.
*H04B 1/69* (2011.01)
(52) U.S. Cl.
USPC ........... 375/146; 375/295; 375/130; 375/376; 375/140; 375/141; 375/144
(58) Field of Classification Search .................. 375/295, 375/146, 130, 376, 140, 141, 144
See application file for complete search history.

(56) References Cited

U.S. PATENT DOCUMENTS

| | | | |
|---|---|---|---|
| 8,164,367 B1 * | 4/2012 | Bal et al. | 327/157 |
| 2007/0189360 A1 | 8/2007 | Mobin et al. | |
| 2008/0107154 A1 * | 5/2008 | Hsiao-Chyi | 375/130 |
| 2008/0303566 A1 * | 12/2008 | Shen et al. | 327/157 |
| 2011/0019718 A1 * | 1/2011 | Chiang et al. | 375/141 |

FOREIGN PATENT DOCUMENTS
WO  WO 2006/044586 A2  4/2006

* cited by examiner

*Primary Examiner* — Siu Lee
(74) *Attorney, Agent, or Firm* — Kermit D. Lopez; Luis M. Ortiz; Ortiz & Lopez, PLLC (57) ABSTRACT

A system and method for generating a spread spectrum clock signal with a constant ppm offset as a function of a repetition number. A phase interpolator can be configured in association with of a phase-locked loop circuit in order to provide a phase movement from a bit clock generated by the PLL circuit. A repetition number divider computes the repetition number for each time slot in a piece-wise SSC modulation profile. A noise shaping modulator can be employed for modulating a fractional part associated with the repetition number. A repetition counter and a phase accumulator receives an integer part of the repetition number and counts unit interval clock periods equal to a sum of integer and the sigma-delta modulated fractional parts of the repetition number. The phase accumulator can be incremented and/or decremented based on the sign of the spread spectrum direction.

20 Claims, 5 Drawing Sheets

SPREAD SPECTRUM CLOCK SIGNAL GENERATOR METHOD AND SYSTEM

TECHNICAL FIELD

Embodiments are generally related to the generation of clock signals and utilized in high-precision electronic devices. Embodiments are additionally related to SSC (Spread Spectrum Clock) generating devices and techniques. Embodiments are also related to sigma-delta noise shaping modulators.

BACKGROUND OF THE INVENTION

Spread spectrum clocks can be employed in integrated circuits (e.g., IC chips, chipsets, processors, etc.) to reduce the adverse effect of electro-magnetic interference (EMI). A spread spectrum-clocking generator (SSCG), for example, modulates the frequency of an oscillation clock signal so as to spread the bandwidth of the clock signal and lower EMI noise magnitude. For example, a serial advanced technology attachment (SATA) bus adapted for transferring data between devices may operate with high data transfer rates. At such high data rates, the generation of electro-magnetic interference can be significant. The spectral components of the electro-magnetic interference emissions can typically include peak amplitudes at the fundamental frequency of the device. The SATA standard bus with spreading technique can define a down spread to, for example, −5000 ppm, a reduced down spread to −2300 ppm or a center spread from 2300 ppm to −2300 ppm. A spread spectrum-clocking generator can thus generate a spread spectrum clocking profile that reduces the spectral amplitude of electro-magnetic interference components associated with the device.

Figure 1:
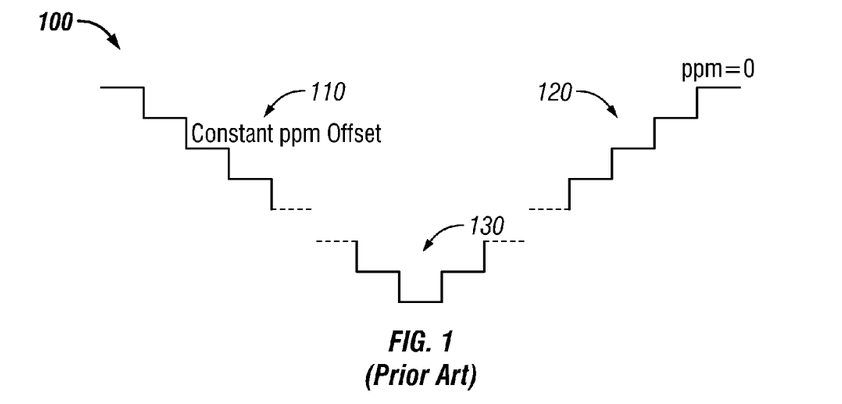
FIG. 1 illustrates a graphical representation of a prior art piece-wise linear emulation for a triangular modulation profile.

The majority of prior art approaches for generating spread spectrum clocking involve the use of piece-wise linear emulation for generating a triangular modulation profile. FIG. 1 illustrates a graphical representation of a prior art piece-wise linear emulation of a triangular SSC profile 100. The triangular SSC profile 100 can be sub-divided into one or more regions such as regions 110, 120 and 130 with a constant ppm offset. The constant ppm offset in each region of the triangular SSC profile 100 can be emulated by a constant rate of a phase movement, as illustrated in equation (1) below:

$$F = F_0 + d\phi/dt \quad (1)$$

In equation (1), the parameter $F_0$ generally represents a reference frequency from which the ppm offset can be generated. The parameter $\phi$ generally represents a phase.

Figure 2:
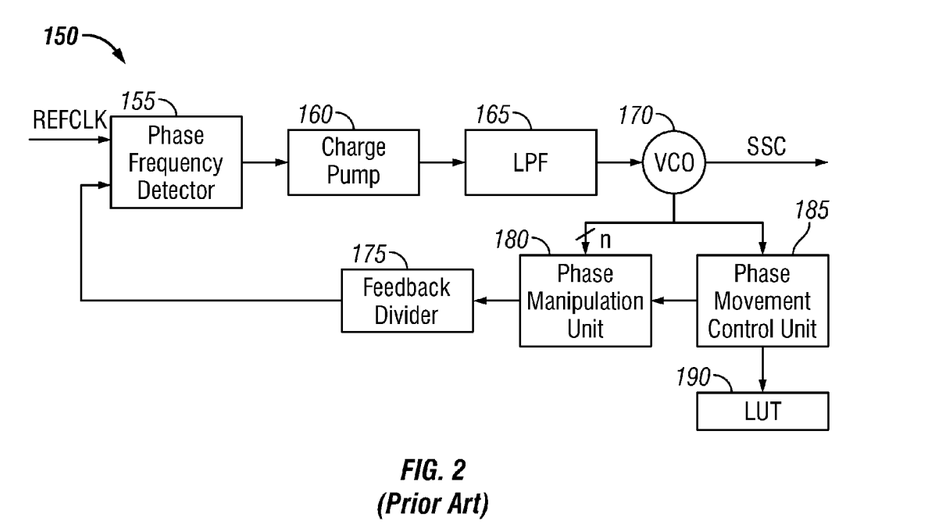
FIG. 2 illustrates a block diagram of a prior art spread spectrum clock generator.

FIG. 2 illustrates a block diagram of a prior art SSC generator 150. The SSC generator 150 generally includes a phase and frequency detector (PFD) 155, a charge pump (CP) 160, a loop filter (LPF) 165, a voltage controlled oscillator (VCO) 170, a phase manipulation unit 180, and a feedback divider (FBD) 175. In the configuration depicted in FIG. 2, reference clock (REFCLK) can be employed as a '0' ppm offset clock in the phase and frequency detector 155 to create a ppm offset with respect to this clock. The phase and frequency detector 155 compares the reference clock with a feedback clock from the feedback divider 175 in order to align the frequency and phase of both the reference clock and the feedback clock. The output of phase and frequency detector 155 controls the charge pump 160. The output of the charge pump 160 may be low pass filtered by the loop filter 165 in order to control the voltage-controlled oscillator 170.

In the absence of a phase manipulation unit 180, the output of the voltage control oscillator 170 can be divided down in the feedback divider 175 to return to the phase and frequency detector 155. Hence, the circuit creates a bit clock in the voltage control oscillator 170 which may be higher in frequency than the reference clock by the divisor coefficient of the feedback divider 175. Such a frequency can be related to the bit rate or unit interval (UI) of a serial data transmitter. When the phase manipulation unit 180 is activated, input to the feedback divider 175 can be delayed in the phase by the value changing in time.

As the phase and frequency detector 155 tends to maintain and align frequency and phase of the reference clock and the feedback clock, the output of voltage control oscillator 170 is "pushed back" by the same amount of phase delay moving the phase of SSC in time. Hence, if the rate of a phase movement is constant in time, it may correspond to the constant ppm frequency offset of SSC in respect to the reference clock. The direction of phase movement can influence the sign of ppm offset. For example, if phase delay increases with the time, it can correspond to SSC that may be higher in frequency than the reference clock.

A phase movement control unit 185 retrieves necessary data from a LUT (Look Up Table) 190 with respect to each region (e.g., such as regions 110, 120 and 130) with constant ppm offset and block 180 processes a multi tap output from the voltage control oscillator 170 in order to create a phase change in time. Such a look up table 190 can be prohibitively large as the number of constant ppm offset regions increases. The memory including the look up tables 190 requires a significant portion of the area of an integrated circuit, which can be quite expensive to implement.

Such a prior art approach requires a relatively high ppm step between the constant ppm offset regions in order to keep the number of regions under 16 or 32. Additionally, the phase movement control unit 185 must operate at the same frequency as the phase manipulation unit 180, which can be difficult to design.

Based on the foregoing, it is believed that a need exists for an improved spread spectrum clock signal generator system and method that uses a repetition number (RN). A need also exists for an improved sigma-delta modulator for noise shaping a SSC modulation profile, as described in greater detail herein.

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the disclosed embodiment to provide for an improved spread spectrum clocking (SSC) generator system and method.

It is another aspect of the disclosed embodiment to provide for an improved sigma-delta modulator for noise shaping a SSC modulation profile.

It is a further aspect of the disclosed embodiment to provide for an improved method for generating a spread spectrum clock signal and a constant ppm offset as a function of a repetition number.

The aforementioned aspects and other objectives and advantages can now be achieved as described herein. A system and method for generating a spread spectrum clock signal and a constant ppm offset as a function of a repetition number is disclosed herein. A phase interpolator can be configured in association with a phase-locked loop (PLL) circuit in order to provide a phase movement from a bit clock generated by the PLL circuit. A repetition number divider further computes the repetition number for each time slot in a piece-wise SSC modulation profile. A sigma-delta noise-shaping modulator can be employed for modulating a fractional part associated with the repetition number (RN). A repetition counter and a phase accumulator receive an integer part of the repetition number and counts unit interval clock periods equal to a sum of integer and the sigma-delta fractional parts of the repetition number. The phase accumulator can be incremented and/or decremented based on a sign of the spread spectrum ppm offset in order to provide easy programming and calculation of the SSC modulation profile.

The phase-locked loop circuit includes a phase and frequency detector and a voltage controlled oscillator for generating the spread spectrum clocking profiles. A clock divider divides an input clock signal into one slower rate clock for a slot counter. The slot counter associated with the repetition number divider receives a maximum slot number $SN_{max}$, a central spread control and the divided down bit clock in order to generate a slot number, and a spread spectrum direction (SSDIR) with respect to each counting cycle. The spread spectrum direction defines the direction of the phase movement and thereby defines the sign of the ppm offset.

The repetition number with respect to each time slot in the modulation profile can be calculated by dividing the maximum repetition number provided to the repetition number divider from the external control, by the slot number. The sigma delta noise-shaping modulator creates an integer value (e.g., 1 or 0), such that the average in time is equal to the fractional part, which is added to the integer part. The impact of noise shaped output of the repetition number counter 265 is further filtered in the phase-locked loop circuit. The sigma delta noise shaping modulator can generate a succeeding value of integer repetition number output at the end of each counting cycle of the repetition counter which is equal in average to the fixed point repetition number. The repetition number based SSC generation with sigma-delta noise shaping of the fractional part of the repetition number permits for easy programming and calculation on-the-fly of the triangular modulation profile. Such an approach reduces spectral amplitude of electromagnetic interference (EMI) components over a substantial bandwidth.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

Figure 3:
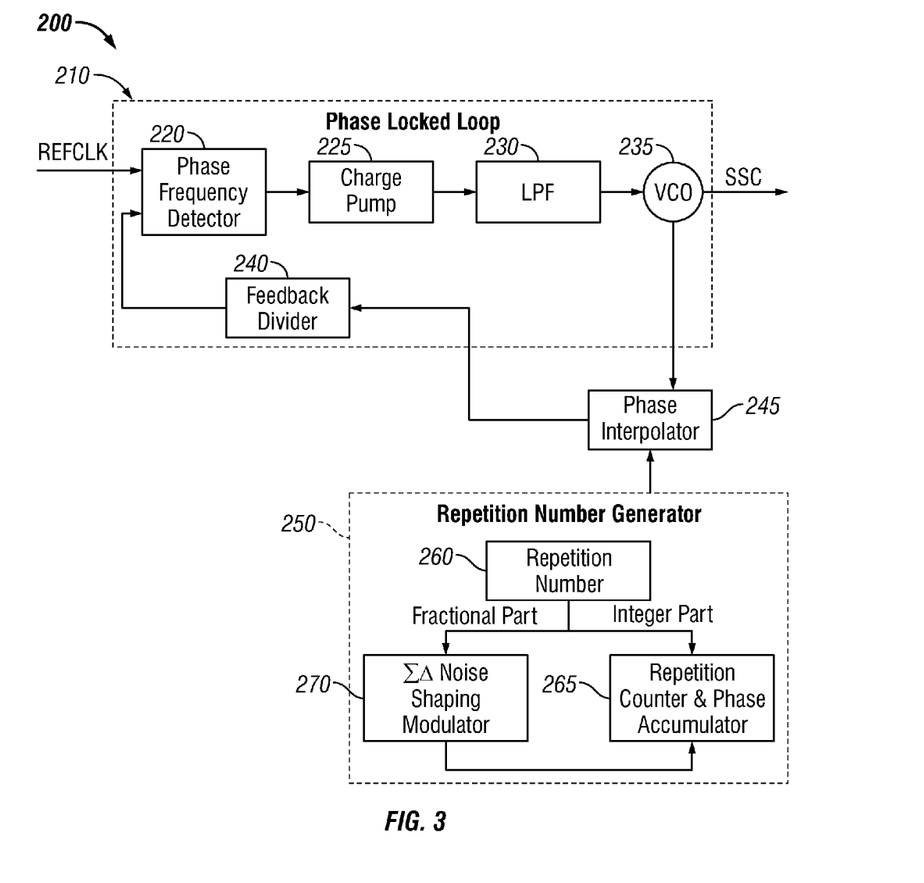
FIG. 3 illustrates a block diagram of a spread spectrum clock generator associated with a repetition number generator, in accordance with the disclosed embodiments.

FIG. 3 illustrates a block diagram of a spread spectrum clocking (SSC) generator 200 associated with a repetition number generator 250, in accordance with the disclosed embodiments. The SSC generator 200 disclosed in FIG. 3 can be configured to generate one or more spread spectrum clocking profiles that reduce the spectral amplitude of EMI components over a substantial bandwidth. The SSC generator 200 generally includes a phase locked loop (PLL) 210 and a phase interpolator 245 associated with a repetition number generator 250. The phase locked loop 210 further includes a phase and frequency detector 220, a charge pump 225, a loop filter (LPF) 230, a voltage controlled oscillator (VCO) 235, and a feedback divider 240. In the configuration shown in FIG. 3, the output from the phase and frequency detector 220 is supplied as input to the charge pump 225, which in turn produces an output signal that is fed as input to the loop filter 230. Output from the LPF or loop filter 230 is sent as input to the voltage controlled oscillator 235, which in turn supplies an SSC output and an output that is fed to the phase interpolator 245. Output from the phase interpolator 245 is provided to the feedback divider 240, which in turn provides output that is fed as input to the phase and frequency detector 220. Note that the phase and frequency detector 220 also receives as input, an REFCLK clock signal.

The phase locked loop 210 generally operates in a closed loop mode. The charge pump 225 sources or sinks current in order to charge or discharge the loop filter 230. The loop filter 230 outputs a voltage corresponding to the charge signal generated in the charge pump 225 as a control voltage to the VCO 235. The VCO 235 outputs a clock signal at an oscillating frequency corresponding to the control voltage generated in the loop filter 230.

The phase interpolator 245 can be configured in a feedback path of the phase locked loop 210 in order to generate a phase movement from a bit clock generated by the phase locked loop 210. The interpolator 245 can be configured in association with the phase locked loop 210 using, for example, '4' unit interval (UI) clock. The phase interpolator 245, in conjunction with repetition counter 265, is capable of adjusting the spread spectrum clock frequency. The interpolator 245 receives the clock signal from the VCO 235 and generates discrete clock signals having the same period, but shifted in phase by predetermined offsets. The repetition number generator 250 can be configured in association with the phase locked loop 210 using '8' unit interval clock to provide control signals with respect to the phase interpolator 245. The repetition number generator 250 provides the control signals to the phase interpolator 245 as a function of a repetition number 260.

A sigma-delta noise-shaping modulator 270 associated with the repetition number generator 250 modulates a fractional part of the repetition number 260 in order to create an integer (e.g., 0 or 1) equal in average to the fractional part of repetition number. In general, sigma-delta (ΣΔ) modulation is a method for encoding high-resolution signals into lower resolution signals using pulse-density modulation. Note that the sigma-delta noise shaping modulator 270 described herein can be a hardware circuit, utilized in a wide range of applications such as digital-analog converters in order to provide a degree of shaping or filtering of quantization noise associated with a signal.

The modulation profile can be created and transmitted through the sigma-delta noise-shaping modulator 270, which represents the same value in a reduced bit count by pushing the quantization noise into the higher frequency range. An integer part of the repetition number 260 plus output from the sigma-delta noise shaping modulator 270 can be provided to a repetition counter and the phase accumulator 265, which controls phase interpolator 245. The output of interpolator 245 with particular phase movement in time corresponding to the desired ppm offset is passed to the feedback divider 240 which in conjunction with the closed loop PLL 210 provides for the generation of ppm offset SSC clock.

Figure 4:
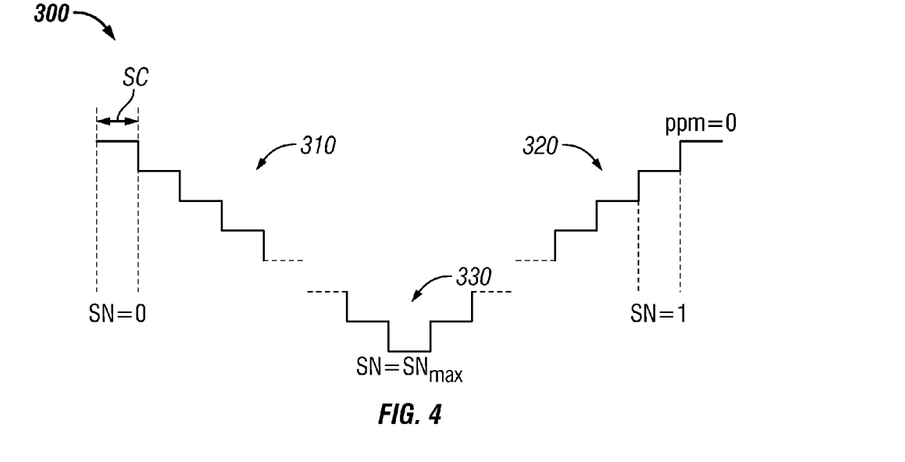
FIG. 4 illustrates a graphical representation of a piece-wise linear emulation for a triangular modulation profile as a function of a repetition number, in accordance with the disclosed embodiments.

FIG. 4 illustrates a graphical representation of a piece-wise linear emulation for a triangular SSC modulation profile 300 as a function of the repetition number 260, in accordance with the disclosed embodiments. Note that in FIGS. 1-7, identical or similar blocks are generally indicated by identical reference numerals. The triangular SSC profile 300 can be subdivided into one or more regions such as region 310, 320 and 330 with respect to a constant ppm offset. The constant ppm offset in each region of the triangular SSC profile 300 can be emulated by a constant rate of phase movement. The frequency of the modulation profile 300 ranges between 30 to 33 kHz.

A slot duration count (SC) in the modulation profile 300 defines the duration for each time slot in the SSC profile 300. The slot duration count can be represented as a number of periods of a clock (e.g., 8 UI clock). For example, the slot duration count can be assumed as 512. Note that the slot duration count cannot be limited to the proposed value and can be programmed in accordance with the design considerations. The slot count can count from a value of '0' to '$SN_{max}$' and vice-versa. The SSC modulation profile 300 can be emulated by ($2*SN_{max}-1$) time slots with a constant ppm offset at each time slot. The frequency of the repetitive triangular SSC modulation profile 300 can be represented as follows:

$$1/SC*8UI*(2*SN_{max}) \quad (2)$$

For example, the frequency of the modulation profile 300 for a data transferring at a rate of 12 Gbps speed with slot duration of 512 8 UI clock periods and $SN_{max}=47$ can be calculated as follows:

$$1/(512*8/12E9*(2*47))=31.502 \text{ kHZ} \quad (3)$$

The repetition number 260 with respect to each time slot in the triangular modulation profile 300 can be calculated by dividing $RN_{max}$ provided to the repetition number divider 365 from an external control which can be represented as follows:

$$RN_i = RN_{max}/SN \quad (4)$$

wherein, $RN_{max}$ represents the maximum repetition number with respect to the SSC profile 300 and SN is a slot number.

The frequency offset in each time slot can be defined by a corresponding repetition number represented as follows:

$$ppm=10^6/((RN_i)*2*60) \quad (5)$$

wherein, $RN_i$ represents the repetition number, '2' represents a coefficient which is added as a ratio between the 8 UI processing clock and 4 UI interpolation clock and '60' represents the number of interpolation steps over one period of 4 UI clock.

Figure 5:
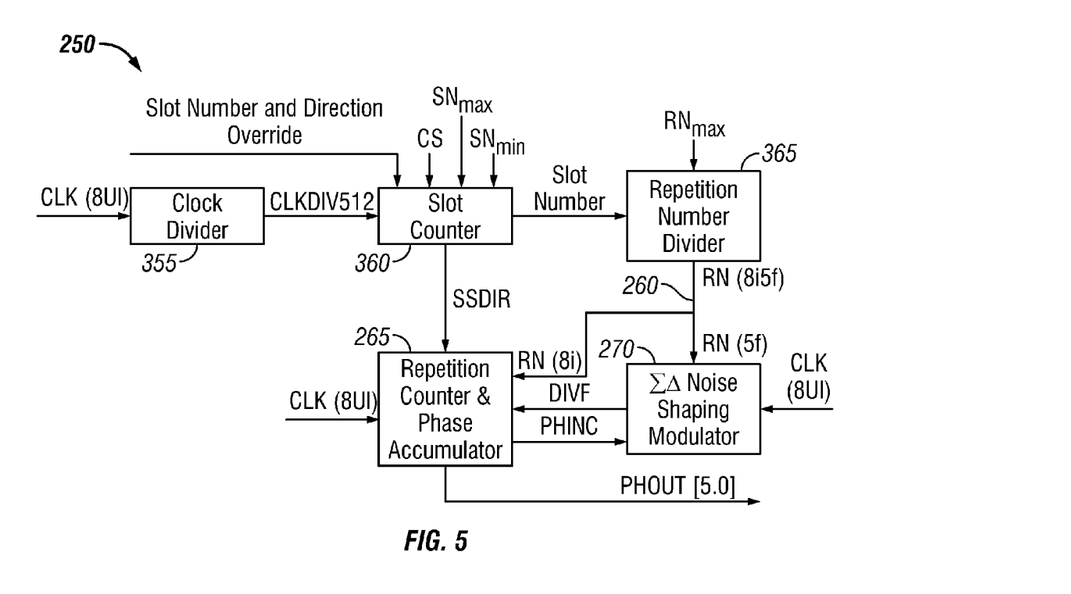
FIG. 5 illustrates a block diagram of the repetition number generator, in accordance with the disclosed embodiments.

FIG. 5 illustrates a block diagram of the repetition number generator 250, in accordance with the disclosed embodiments. The repetition number generator 250 includes a repetition number divider 365, a clock divider 355, a slot counter 360, the sigma-delta modulator 270, and the repetition counter and phase accumulator 265. The clock divider 355 divides an input clock signal into a slower rate clock for the slot counter 360. The slot counter 360 counts periods of the output clock of the clock divider 355.

The slot counter 360 receives the following inputs defining the sequence of the slot number generation: a maximum slot number $SN_{max}$, a minimum slot number $SN_{min}$, a central spread control (CS) from an external source, and CLKDIV from the clock divider 355. The slot counter 360 generates a slot number and the spread spectrum direction (SSDIR) with respect to each time slot in the slot counter 360. When $SN_{min}$ is set to '0', the slot counter 360 tends to down spread spectrum from '0' to a maximum negative ppm offset. Similarly, when $SN_{min}$ is greater than '0', the slot counter 360 permits for a minimum ppm offset non equal to zero.

The repetition number divider 365 calculates the repetition number 260 for each time slot in the modulation profile 300. The repetition number divider 365 divides the maximum repetition number provided to the repetition number divider 365 from the external control by the slot number. The sigma-delta noise shaping modulator 270 modulates the fractional part of the repetition number 260. The repetition counter and phase accumulator 265 receives the integer part of the repetition number 260 and counts the number of CLK clock periods by adding the integer of the repetition number 260 and the output of the sigma-delta noise shaping modulator 270 (e.g., 0 or 1).

The sigma-delta noise shaping modulator 270 modulates its output between values of 0 or 1 such that the average value is equal to the fractional part of repetition number 260. The sigma delta noise shaping modulator 270 also generates a succeeding value of fractional repetition number output at the end of each counting cycle of the repetition counter 265. The phase accumulator 265 can be incremented and/or decremented based on a sign of the spread spectrum ppm offset (SSDIR) in order to provide calculation in the modulation profile "on the fly". Note that the spread spectrum direction (SSDIR) can define the direction of the phase movement and the sign of the ppm offset in the modulation profile 300.

Figure 6:
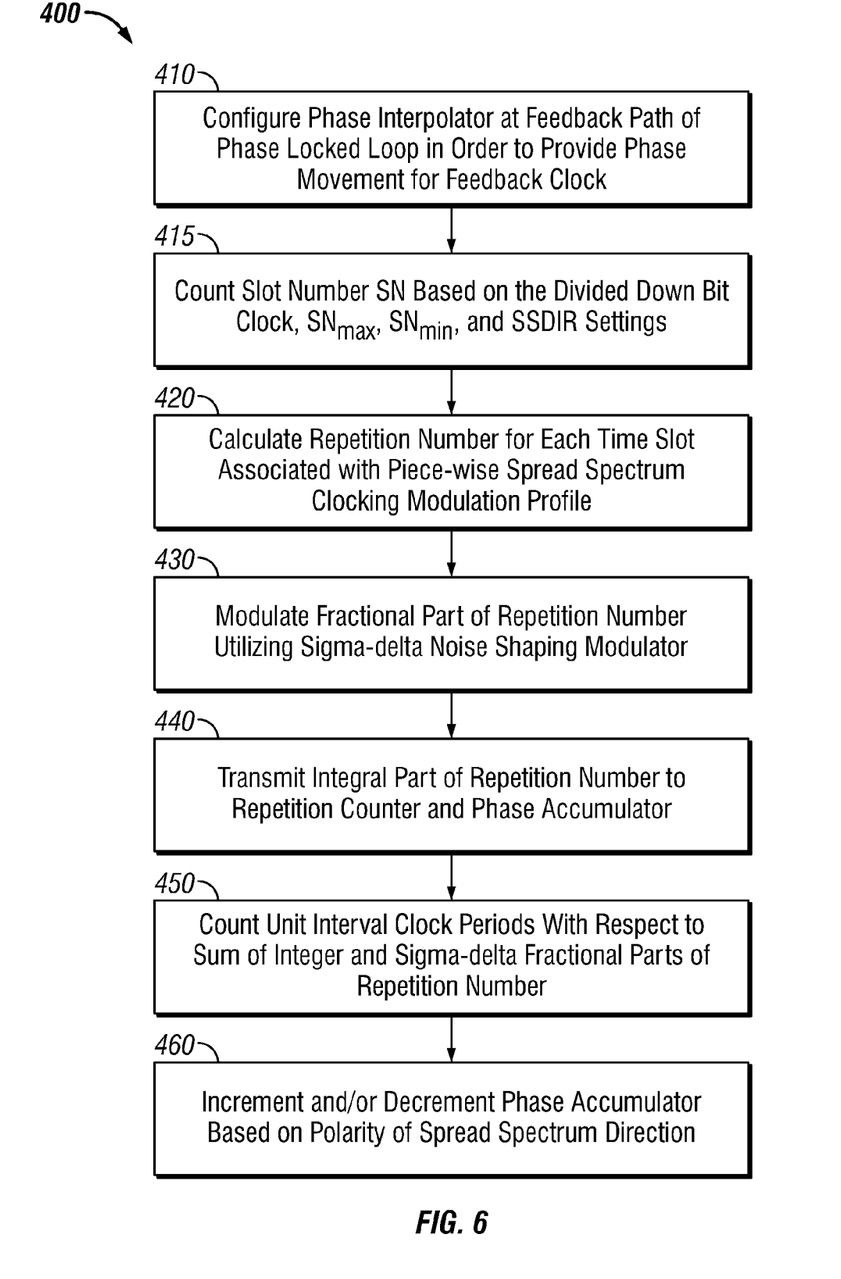
FIG. 6 illustrates a high level flow chart of operation illustrating logical operational steps of a method for generating a spread spectrum clock signal as a function of the repetition number, in accordance with the disclosed embodiments.

FIG. 6 illustrates a high level flow chart of operation illustrating logical operational steps of a method 400 for generating the SSC signal as a function of the repetition number 260, in accordance with the disclosed embodiments. Again as reminder, in FIGS. 1-7, identical or similar blocks are generally indicated by identical reference numerals. The phase interpolator 245 can be configured at the feedback path of the phase-locked loop circuit 210 for providing the phase movement for the feedback clock, as illustrated at block 410. Following the processing of the operation indicated at block 410, an operation can be implemented to count the slot number SN based on the divided down bit clock, $SN_{max}$, $SN_{min}$, and SSDIR settings, as described at block 415. The repetition number 260 for each time slot associated with the modulation profile 300 can be calculated utilizing the repetition number divider 365 in order to provide a control signal with respect to the phase interpolator 245, as depicted at block 420.

The fractional part of the repetition number 260 can be modulated utilizing the sigma-delta noise shaping modulator 270, as indicated at block 430. The integer part of the repetition number 260 can be transmitted to the repetition counter and phase accumulator 265, as depicted at block 440. Thereafter, the number of clock periods can be counted at the repetition counter and the phase accumulator 265 by adding the integer and the sigma-delta fractional parts of the repetition number 260, as illustrated at block 450. Finally, the phase accumulator 265 can be incremented and/or decremented based on the sign of the spread spectrum ppm offset in order to provide calculation of the modulation profile 300 "on the fly", as depicted at block 460.

Figure 7:
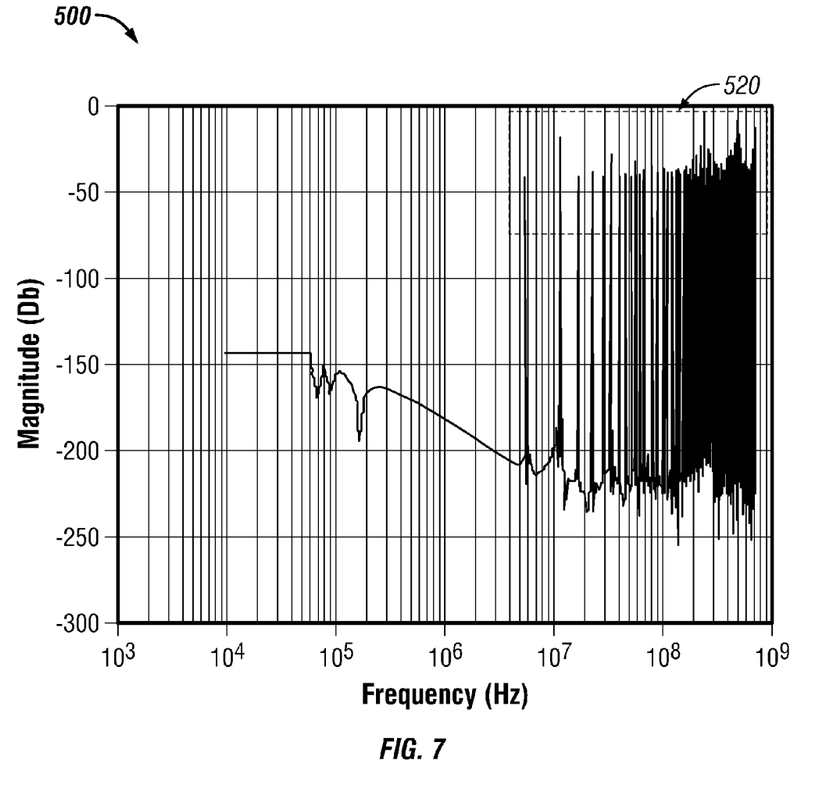
FIG. 7 illustrates a graphical representation illustrating frequency characteristics of a noise modulated signal, in accordance with the disclosed embodiments.

FIG. 7 illustrates a representation of a graph 500 with data representative of frequency characteristics of a noise modulated signal, in accordance with the disclosed embodiments. As indicated in graph 500 of FIG. 7, a dotted region 520 generally represents noise shaping of the fractional part of the repetition number 260 at a time slot '47' for 5000 ppm offset. For example, if the interpolator 245 includes 60 steps per one period of 4 UI clock, then in order to implement 5000 ppm offset the repetition number 260 can be '1.65625'. The ppm offset with respect to the repetition number '1.65625' can be represented as follows:

$$\text{ppm} = 10^6 / (1.65625 * 2 * 60) = 5031 \text{ ppm} \quad (6)$$

The calculated ppm offset value includes a fractional noise error. The sigma delta divider 270 modulates such noise in the fractional part of the repetition number 260 and provides a modulated control signal for the interpolator 245. The modulated repetition number 260 for 5000 ppm can be calculated as follows (note: the difference between the number below and the fractional part in equation (6) is due to fixed point representation of the fractional number with 7 fractional bits):

$$DIVF = 7b10101011 = 85/128 = 0.6640625 \quad (7)$$

The system and method can therefore provide effective SSC signals in order to reduce spectral amplitude of electromagnetic interference (EMI) in electronic devices. The sigma-delta noise shaping of the fractional part of the repetition number permits for easy programming and calculation on-the-fly of the modulation profile with a constant ppm offset.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A method for generating a spread spectrum docking signal, comprising:
    calculating a repetition number with respect to each time slot associated with a modulation profile by dividing a maximum repetition number with respect to a repetition number divider from an external control by a slot number;
    modulating a fractional part with respect to said repetition number via a sigma-delta noise shaping modulator in order to thereafter transmit an integer part with respect to said repetition number to a repetition counter and a phase accumulator; and
    counting a plurality of unit interval clock periods in order to thereafter increment and/or decrement said repetition counter and said phase accumulator based on a sign of a spread spectrum ppm offset thereby providing an easy computation with respect to said modulation profile.

2. The method of claim 1 further comprising configuring a phase interpolator in association with a phase-locked loop circuit in order to provide a phase movement from a bit clock generated by said phase-locked loop circuit.

3. The method of claim 1 further comprising generating said slot number via a slot counter in order to thereafter provide said slot number to said repetition number divider to generate said repetition number.

4. The method of claim 1 further comprising adding a modulated value of said fractional part to said integer part in order to modulate and filter noise in a phase-locked loop circuit.

5. The method of claim 1 further comprising generating a succeeding value of said fractional part output at an end of each counting cycle of said repetition counter.

6. The method of claim 1 further comprising adding said integer part and said fractional part of said repetition number to count said plurality of unit interval clock periods.

7. The method of claim 1 further comprising generating at least one control signal with respect to a phase interpolator utilizing said repetition counter and phase accumulator.

8. A spread spectrum clocking generator system, said system comprising:
    a repetition number divider to generate a repetition number with respect to at least one time slot associated with a modulation profile by dividing a maximum repetition number provided to said repetition number divider from an external control by a slot number;
    a sigma-delta noise shaping modulator associated with said repetition number divider to modulate a fractional part of a said repetition number; and
    a repetition counter and a phase accumulator that receive an integer and a modulated fractional part and count a plurality of unit interval clock periods, wherein said repetition number and said phase accumulator are incremented/decremented based on a sign of a spread spectrum ppm offset in order to generate a constant ppm offset.

9. The system of claim 8 further comprising a phase interpolator in association with a phase-locked loop circuit in order to provide a phase movement from a bit clock generated by said phase-locked loop circuit.

10. The system of claim 8 wherein said repetition counter and said phase accumulator generates at least one control signal with respect to a phase interpolator.

11. The system of claim 8 further comprising a clock divider to divide input bit clock into a slower rate clock for a slot counter.

12. The system of claim 8 wherein said modulation profile comprises a piece-wise triangular spread spectrum clocking profile.

13. A system for generating a spread spectrum clocking signal, said system comprising:
    a processor;
    a data bus coupled to said processor; and
    a computer-usable medium embodying computer code, said computer-usable medium being coupled to said data bus, said computer program code comprising instructions executable by said processor and configured for:
        calculating a repetition number with respect to each time slot associated with a modulation profile by dividing a maximum repetition number with respect to a repetition number divider from an external control by a slot number;
        modulating a fractional part with respect to said repetition number via a sigma-delta noise shaping modulator in order to thereafter transmit an integer part with respect to said repetition number to a repetition counter and a phase accumulator; and counting a plurality of unit interval dock periods in order to thereafter increment and/or decrement said repetition counter and said phase accumulator based on a sign of a spread spectrum ppm offset thereby providing an easy computation with respect to said modulation profile.

14. The system of claim 13 further comprising a phase interpolator in association with a phase-locked loop circuit in order to provide a phase movement from a bit clock generated by said phase-locked loop circuit.

15. The system of claim 13 wherein said instructions are further configured for generating said slot number via a slot counter in order to thereafter provide said slot number to said repetition number divider to generate said repetition number.

16. The system of claim 13 wherein said instructions are further configured for adding a modulated value of said fractional part to said integer part in order to modulate and filter noise in a phase-locked loop circuit.

17. The system of claim 13 wherein said instructions are further configured for generating a succeeding value of said fractional part output at an end of each counting cycle of said repetition counter.

18. The system of claim 13 wherein said instructions are further configured for adding said integer part and said fractional part of said repetition number to count said plurality of unit interval clock periods.

19. The system of claim 13 wherein said instructions are further configured for generating at least one control signal with respect to a phase interpolator utilizing said repetition counter and phase accumulator.

20. The system of claim 13 wherein said instructions are further configured for:

generating said slot number via a slot counter in order to thereafter provide said slot number to said repetition number divider to generate said repetition number; and adding a modulated value of said fractional part to said integer part in order to modulate and filter noise in a phase-locked loop circuit.

* * * * *